United States Patent [19]

Shapanus et al.

[11] Patent Number: 5,513,002
[45] Date of Patent: Apr. 30, 1996

[54] OPTICAL CORONA MONITORING SYSTEM

[75] Inventors: Vincent F. Shapanus, Towson; Kevin J. Phipps, Baltimore, both of Md.

[73] Assignee: The A.R.T. Group, Inc., Towson, Md.

[21] Appl. No.: 210,027

[22] Filed: Mar. 17, 1994

[51] Int. Cl.$^6$ ........................................... G01J 3/30
[52] U.S. Cl. .......................................... 356/313
[58] Field of Search ............................ 250/554, 368, 250/390.11, 367; 356/313, 405, 418, 315; 385/115–117, 76, 77

[56] References Cited

U.S. PATENT DOCUMENTS

| | | |
|---|---|---|
| 2,577,814 | 12/1951 | Saunderson et al. . |
| 2,577,815 | 12/1951 | Saunderson et al. . |
| 2,774,276 | 12/1956 | Glasser et al. . |
| 2,951,164 | 8/1960 | Timms . |
| 2,975,785 | 3/1961 | Sheldon . |
| 3,144,551 | 8/1964 | Webb et al. . |
| 3,244,894 | 4/1966 | Steele et al. . |
| 3,407,323 | 10/1968 | Hand . |
| 3,413,481 | 11/1968 | Berry . |
| 3,527,954 | 9/1970 | Hoffman . |
| 3,528,749 | 9/1970 | Bowker . |
| 3,613,062 | 10/1971 | Bloice . |
| 3,636,345 | 1/1972 | Hirschel . |
| 3,684,378 | 8/1972 | Lord . |
| 3,690,772 | 9/1972 | Endl . |
| 3,824,391 | 7/1974 | Noltingk et al. . |
| 3,973,849 | 8/1976 | Jackson et al. . |
| 3,986,777 | 10/1976 | Roll . |
| 4,047,819 | 9/1977 | Goldberg . |
| 4,131,367 | 12/1978 | French et al. ............... 356/405 |
| 4,176,369 | 11/1979 | Nelson et al. . |
| 4,280,184 | 7/1981 | Weiner et al. . |
| 4,396,903 | 8/1983 | Habicht et al. . |
| 4,555,800 | 11/1985 | Nishikawa et al. .......... 250/554 X |
| 4,561,104 | 12/1985 | Martin . |
| 4,575,241 | 3/1986 | Demers et al. .............. 356/316 |
| 4,907,281 | 3/1990 | Hirvonen et al. ............ 250/554 |
| 4,912,326 | 3/1990 | Naito . |
| 5,000,535 | 3/1991 | Churchill ..................... 385/115 |
| 5,198,666 | 3/1993 | Bateman ..................... 250/294 |
| 5,313,065 | 5/1994 | Reed .......................... 250/367 |

Primary Examiner—Vincent P. McGraw
Assistant Examiner—K. P. Hantis
Attorney, Agent, or Firm—Reed Smith Shaw & McClay

[57] ABSTRACT

An instrument system for monitoring corona and like conditions of electrical equipment such as generators includes an optical probe which receives light from a plurality of different areas in the equipment and separately conveys the light acquired from each area to a position-sensitive photoelectric converter. The probe includes optical fibers with terminal ends disposed in spaced holes in the wall of a tubular housing. The output of the photoelectric converter is analyzed to determine the presence of corona, arcing, flame ignition combustion, or smoldering conditions at each of the monitored areas in the equipment, the severity of such conditions, and the identity of materials involved in such conditions based on the intensity and spectral content of the acquired light. The photoelectric converter includes a photomultiplier, a photodiode array, and means for automatically directing the acquired light to either one in accordance with its intensity.

36 Claims, 4 Drawing Sheets

OPTICAL CORONA MONITORING SYSTEM

FIELD OF THE INVENTION

This invention relates to monitoring of physical conditions within a predetermined space by collection and detection of optical radiation emitted within the space. More particularly, this invention relates to monitoring the condition of a piece of electrical equipment by collecting and detecting optical radiation generated at various locations on or in the equipment. Still more particularly, this invention relates to monitoring an electrical machine, such as a generator, to determine the existence of corona discharge, electrical arcing, flame ignition combustion, or smoldering conditions, by collecting light emitted at various locations within the machine and analyzing the collected light to determine whether its characteristics are consistent with such conditions. As used herein, "optical radiation" and "light" include visible light and adjacent wavelength ranges of electromagnetic radiation.

BACKGROUND OF THE INVENTION

There is a great need to determine the condition of certain electrical equipment such as generators and motors. High voltage generators such as are used by electric power utilities are subject to faults and deterioration which can be relatively easily corrected if detected sufficiently early but which can lead to catastrophic failure if left uncorrected. A variety of techniques have been employed to monitor the condition of such equipment in order to evaluate whether or when maintenance should be performed. Such techniques generally measure, directly or indirectly, the quality of the electrical insulation of the equipment. A high voltage generator, such as a 13.2 kV generator used by an electrical utility, includes insulated conductors which are disposed in slots in laminated steel structures. During generator operation, the insulation is subjected to a very large cyclic compressive load. This is a result of the mechanical forces generated by the interaction between the electrical current in the conductor and the magnetic field. Such stresses, together with time and environmental conditions, eventually result in deterioration of the insulation sufficient to permit corona generation. Corona is a localized electrical discharge in a gaseous region adjacent an electrical circuit which occurs due to transient ionization of the gas when the voltage stress in the gas exceeds a critical value, for instance an electric field of about 3000 V/m in air. While corona can arise due to insulation degradation, the corona itself causes further insulation degradation and accelerates the process toward complete equipment failure. While certain measures can be taken to suppress corona, such as applying semiconductive paint over the insulation, they generally merely extend the time until corona occurs.

Corona is a serious problem, and can lead to catastrophic failure of a generator. Accordingly, generator condition monitoring has included corona detection and monitoring of corona-related conditions. For the most part, prior corona detection techniques have required the generator to be taken out of service, which is a substantial disadvantage. One technique is to visually inspect the generator windings to detect the effects of corona on the insulation; corona may leave a white residue. Visual inspection may require substantial disassembly of the generator to access locations where corona may occur, and the visual evidence of corona may be overlooked. Another corona detection technique which requires the generator to be out of service is electrical measurement of the insulation electrical characteristics from which inferences regarding the insulation quality and susceptibility to corona may be drawn. D.C. potentials may be applied to the windings for measurements of charging and static resistive currents; A.C. potentials may be applied to the windings to make insulation power factor measurements; or overvoltages may be applied to determine if the insulation can survive them. A further drawback of these electrical testing methods is that they do not provide information regarding the physical location at which an insulation problem may exist; thus they do not provide information to direct repair and maintenance activities to the appropriate locations. Other techniques are used to detect corona based on the effects it produces while it is occurring; these include detecting radio or ultrasonic noise emitted by the corona. These monitoring techniques also require the electrical load to be removed from the generator, and it is still difficult to locate a corona-generating region using them. Coronas generate ozone, and the telltale odor of ozone has long been used as an indicator of corona. It is difficult to quantify the degree of insulation deterioration and to localize a deteriorated area by detecting corona-generated ozone.

Corona also generates light, and corona detectors which acquire and detect light have been used in research studies regarding corona physics. However, to date optical corona detectors have not been available which can detect corona in an operating electrical machine such as a generator and determine the location where the corona exists.

Utility generators can be taken off line for inspection, testing, maintenance, and repair in the spring and fall, when demand is relatively low, but it is inconvenient and expensive to do so in the summer and winter peak demand seasons. Accordingly, the generators are typically kept on line during the peak seasons, and any minor insulation defects which are overlooked or are incipient and undetectable in the spring and fall can grow to serious or catastrophic problems during the following peak season. Such problems are exacerbated by the fact that there is presently negligible construction of new power plants in the United States; old plants and their generators are therefore being kept on line indefinitely, and the aging equipment is increasingly susceptible to insulation deterioration. When a catastrophic generator failure occurs, it can require eighteen months off line and tens of millions of dollars to repair.

Accordingly, there is a great need for a system for continuously monitoring the condition of a generator while it is in normal operation, which can detect and evaluate the severity and location of corona and related conditions, so that problems can be identified early, monitored during their evolution, emergency action can be taken if necessary, and otherwise repair and maintenance can be scheduled when appropriate, performed efficiently and effectively, and orderly utility operations maintained.

SUMMARY OF THE INVENTION

It is therefore an overall object of the invention to provide a system for detecting corona in electrical machinery while the machinery is in normal operation.

It is a further object of the invention to provide a system which can detect arcing, flame ignition combustion, and smoldering conditions as well as corona.

It is another object of the invention to provide a system which can determine the location(s) within the machinery at which corona or other insulation defect-related conditions are occurring.

It is another object of the invention to provide such a system which can determine the identity of materials which are involved in corona or other insulation defect-related conditions.

It is another object of the invention to provide such a system which can determine the intensity or severity of corona or other insulation defect-related conditions.

It is another object of the invention to provide such a system which displays information relating to the intensity and location of corona or other insulation defect-related conditions.

It is another object of the invention to provide such a system which stores information relating to the condition of the monitored electrical machinery.

It is another object of the invention to provide such a system which is rugged and can reliably operate in the hostile environment of many electrical machines.

In accordance with the foregoing objects, the system of the invention detects optical radiation associated with corona and related conditions of electrical equipment. It includes means for separately acquiring light from different areas within the equipment, means for converting the received light to electrical signals which contain information relating to the locations of light-emitting areas and the intensity of the light emitted in each area, and means for analyzing the electrical signals to determine the existence and nature of such corona and related conditions. In the preferred embodiment, the light acquisition means includes one or more probes which may be disposed with the equipment, each probe having a plurality of optical fibers disposed so as to acquire, at an end of the fiber, light from a predetermined area in the equipment; the fibers also serve to separately conduct the acquired light to a less hostile remote location where the remainder of the system can be located. The preferred photoelectric converter includes a position-sensitive photomultiplier, a photodiode array, and means for directing the acquired light to either one or the other depending on the intensity of the received light. The preferred analyzing means is a computer-based signal processor.

The foregoing and other objects and features of the invention will be understood with reference to the following specification and claims and the drawings.

DETAILED DESCRIPTION OF THE INVENTION

While the following description may refer specifically to the monitoring of a generator, it will be understood that the system of the invention may be used to monitor other electrical machinery and equipment.

Figure 1:
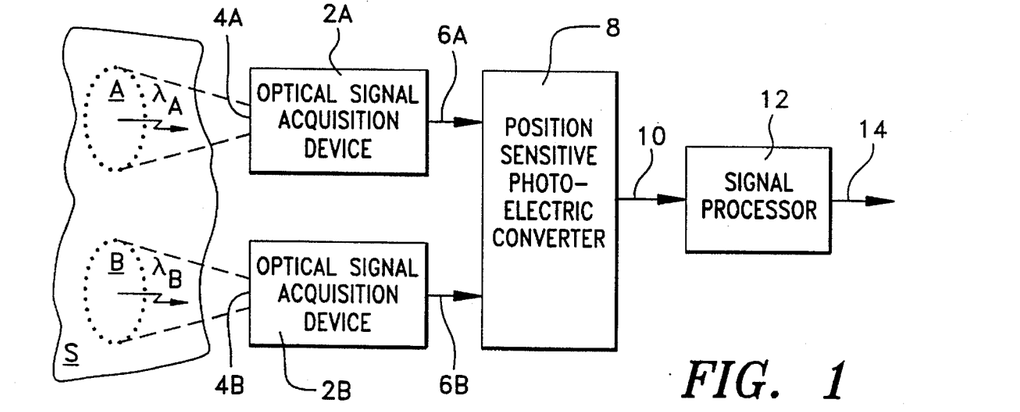
FIG. 1 is a schematic diagram illustrating the basic elements of the system of the invention.

FIG. 1 is a block diagram showing the basic elements of a system according to the invention. The system includes a monitoring instrument, a portion of which is disposed adjacent to a surface S which is to be monitored. Surface S includes a plurality of areas, areas A and B being shown, which are to be separately monitored; these may be different areas within a generator. The instrument includes a plurality of optical signal acquisition devices, 2A and 2B being shown, which are disposed and adapted to separately receive optical radiation, indicated as $\lambda A$ and $\lambda B$, emitted in their direction from the corresponding areas A and B to be monitored. Device 2A includes an aperture 4A through which it receives light from a field of view which includes area A on surface S, and device 2B includes an aperture 4B through which it receives light from a field of view which includes area B of surface S. The devices 2A and 2B are disposed with respect to surface S so that the areas A and B in their fields of view are different, although they may overlap. The light received by devices 2A and 2B is separately conveyed over optical communication channels 6A and 6B to a position-sensitive photoelectric converter 8, so as to preserve the spatial information regarding the source of the light. Although the light acquisition devices are required to be adjacent the surface to be monitored, which is often a hostile environment, the optical communication channels 6A and 6B permit the photoelectric converter and associated electronics to be disposed in a remote location which is likely to be less hostile. Converter 8 converts the light received from the optical communication channels 6 into an electrical signal in electrical communication channel 10, the electrical signal including information representing the intensity of light received from each of the optical communication channels 6 (and thus from each of the monitored areas A and B). A signal processor 12 receives the converter's electrical output signal, processes it to obtain predetermined information (such as whether corona, arcing, flame ignition combustion, or smoldering conditions exist at any of the monitored locations, the location of such conditions, the severity of such conditions, and the nature of materials involved in such conditions) and provides an output 14 representing such information. Output 14 desirably includes a visual display. Thus the instrument includes means for separately acquiring and processing the optical radiation from each of the monitored areas A and B to provide an output 14 separately indicating the nature of the optical activity in each monitored area.

The preferred embodiment of the invention is more specifically described below with respect to FIGS. 2–8. In the preferred embodiment, optical fibers are disposed at a plurality of locations so as to receive light from a plurality of locations in the monitored equipment. The fibers thus function both as sensors or light acquisition devices, which separately acquire light from different monitored areas, and as optical communication channels, which separately convey the light to a detector, thus preserving the spatial information regarding the location at which received light was emitted. Each area may be monitored by single optical fiber or by a plurality of fibers in an optical cable which, for purposes of this invention, function effectively as a single fiber and may be referred to for convenience as a fiber.

Figure 2:
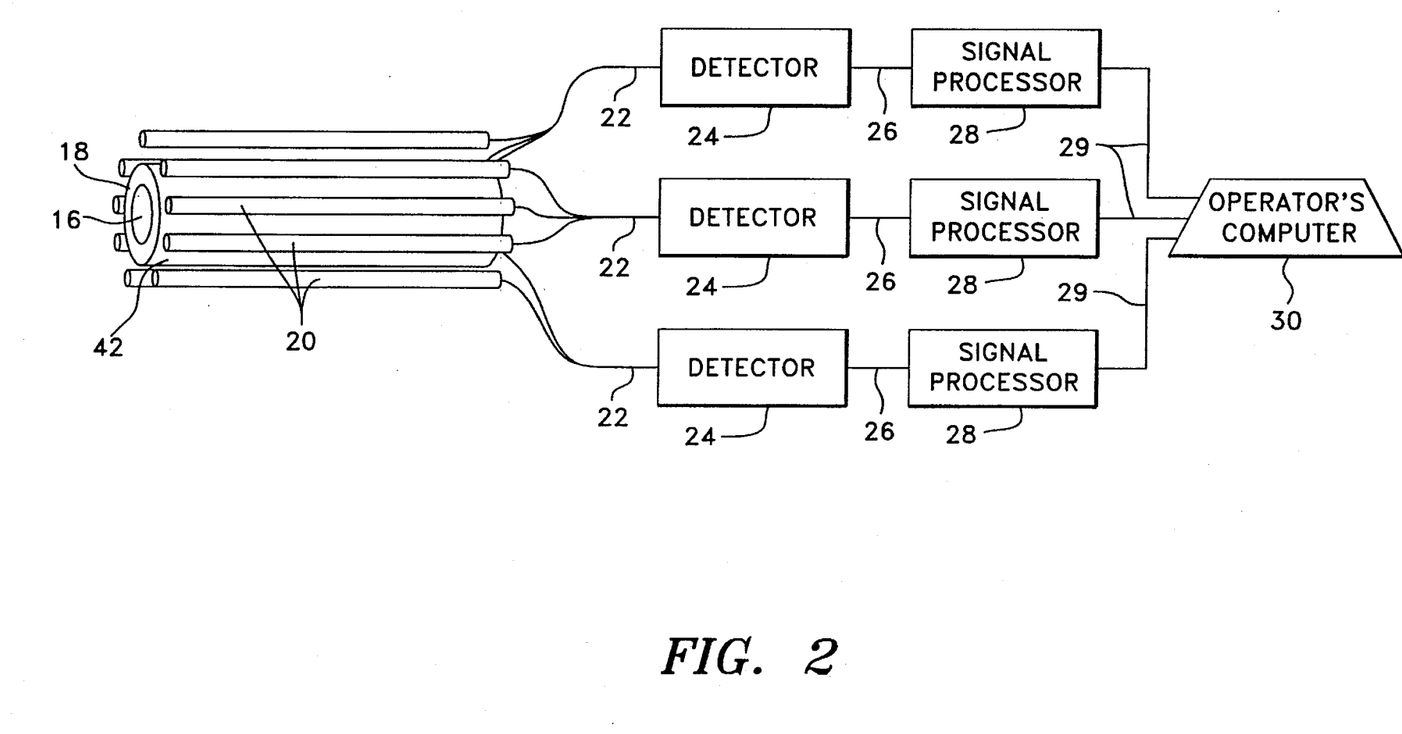
FIG. 2 is a more detailed schematic diagram illustrating the preferred embodiment of the system of the present invention.

FIG. 2 shows, in diagrammatic form, a system according to the invention in a generator monitoring application. The optical corona detection system comprises one or more probe devices 20, fiber optical cable assemblies 22, detector units 24, communication channels 26, initial signal processing devices 28, and an operator's signal processing device or computer 30.

The generator to be monitored includes a stator 18 and a rotor 16 which is rotatably disposed, by means not shown, within the stator 18. The end windings of the stator 18, on the generally cylindrical surface 42, are subject to corona and like problems. To monitor the end windings, a plurality of probes 20 are disposed around the outside of stator 18 so as to receive optical radiation generated by the end windings. Such probes 20 may be supported by and within a generator housing, not shown, in the space between the inner surface of the generator housing and the end winding surface 42. It should be noted that the rotor 16 could be similarly monitored by disposing probes in the space (not shown) between the rotor 16 and stator 18, although such monitoring is more complicated due to the movement of the rotor. Since optical radiation detection requires a line-of-sight relationship between the probe and the monitored surface, a plurality of light acquisition devices is required to cover the entire circumference of the stator 18. It is preferred to dispose the light acquisition devices in elongated probes 20, as shown, each of which receives light from substantially the entire length of the stator but from only a portion of the circumference of the stator. Such probes may be made with a simple and rugged structure which is conveniently mounted in the available space between the generator housing and the stator.

Figure 3:
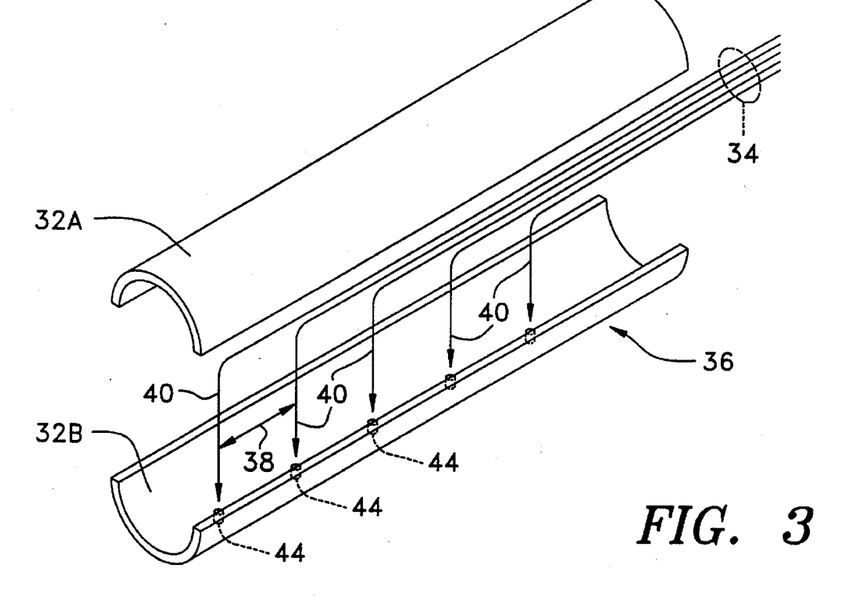
FIG. 3 is an exploded view of the preferred optical probe of the invention.

The probes 20, a preferred form of which is shown in FIG. 3 and described below, each include a plurality of optical fibers having fiber ends which are directed toward the end winding surface 42 to receive light generated at the surface. The fibers from each probe exit the probe structure itself and continue (either directly or through connectors) in fiber optical cable assemblies or bundles 22 to a detector 24, to convey the light received at the probe ends of the fibers to a photoelectric converter within the detector 24. The electrical output of the detector 24 is coupled by an electrical communication channel 26 to a signal processor 28.

The operator's computer 30 receives the processed signals from each signal processor 28 over communication channels 29, and provides an operator interface including a visual display and operator input, such as by a keyboard. It will be understood that the functions of the detector, signal processor, and operator's computer as described herein need not be performed by separate pieces of equipment; for instance, a single piece of equipment could include all detectors, signal processing, and operator interface. The signal processors 28 and operator's computer 30 of FIG. 2 correspond to the single signal processor block 12 shown in FIG. 1.

The number and arrangement of the components will depend in large part on the specifics of the measuring application and design choices in the equipment selected for the application. The position-sensitive photoelectric converter selected will be characterized by its number of detecting elements, their size and their spacing, and these factors determine the number of the selected optical fibers which it can separately detect and consequently the number of separate areas in the generator which it can monitor. A plurality of detectors, as shown in FIG. 2, may be required depending on the number of monitored locations in the system and the number of fibers which can be handled by each detector 24. If a plurality of detectors 24 is used, then it may be desirable as shown to utilize a separate signal processor 28 coupled to each detector 24 to process the signals therefrom.

In routing the optical fibers between the probes 20 and the detectors 24, in a given application, the terminal configurations are more or less predetermined; each of the fibers from a probe must be conveyed to one of the detectors, and a set of fibers from one or more probes must be provided to each detector, the set being chosen to efficiently and effectively use the photosensitive area of the detector. Various options exist in between the terminal ends for grouping and routing the fibers. As illustrated in FIG. 2, the fibers from a set of probes intended for a particular detector may be grouped near the generator and conveyed as a separate bundle 22 to the selected detector 24. Alternatively, all fibers could be grouped in a single bundle and conveyed to the detectors, and split into separate bundles 22 adjacent the detectors. In either event, the fibers are desirably run in protective conduit between the generator and the detectors.

In order to provide position information regarding an event, the system must be able to correlate a detected optical signal with the location of a particular probe fiber which acquired the detected light. This may be accomplished by controlling the routing of the fibers between the probes and the detectors so that a fiber from a predetermined probe location is made to illuminate a particular detector area. Alternatively, and preferably, the fibers may be routed in a random or uncontrolled manner, and the correlation between probe location and detector location determined afterward by selectively illuminating single probe fibers and determining which detector locations respond. Data obtained in this process may be stored in a lookup table or the like and thereafter used during monitoring to associate detector outputs with equipment locations.

Referring to FIG. 3, probe devices 20 are preferably constructed with a plurality of optical fibers disposed at predetermined positions in a support structure. Accordingly, a suitable support structure may be provided which includes a length of tubing, which may be longitudinally sectioned for convenience in fabrication to provide an upper portion 32A and a lower portion 32B. The tubing is preferably made of a nonconductive material, and PVC is believed to be suitable. Optical fibers 34 are assembled in tubing 32 with the terminal ends 40 of the fibers at a longitudinal spacing 38. A terminal end 40 of each fiber is inserted into a preexisting radial hole 44 in the bottom half section 32B of the tubing 32, a plurality of such holes 44 being provided at a spacing 38 so as to establish the spacing of fiber ends 40 along the length of the probe. The top half section of the tubing 32A is then attached to the bottom half 32B. The tubular member 32 thus formed is then "potted" or filled with a nonconductive material to fill all voids between fibers and give the assembled probe structural integrity. So constructed, the detecting fibers are incorporated into a unitary, self-contained, integral, sensor-containing structure such as is commonly referred to in instrumentation as a "probe", as distinguished from an assemblage of mechanically separate components. Polyurethane and epoxy are believed to be suitable materials for filling the voids in the probe structure. The elongated cylindrical probe 20 so constructed may be made with a sufficiently small diameter as to easily fit within generators and the like and sufficiently rugged to survive in such a hostile environment. Such a probe 20 permits sensitive detecting equipment to be remotely mounted in a less hostile environment.

The fibers 34 are brought out of an exit end 36 of the probe which may be provided with probe-mounting or fiber conduit-interfacing structures as desired. Commercially available optical fiber cables are conveniently used in the probe structure; such cables include a plurality of individual optical fibers which are enclosed within protective jacketing. Applicant believes that a suitable optical fiber material is that supplied by Edmund Scientific Co. under its stock number D2536-37, which is a cable containing a strand of 16 plastic fibers in its jacket with a strand diameter of 1 mm. No doubt many other optical fibers are suitable. If attenuation losses over the generator-detector distance are substantial, glass fibers may be preferable. The 1 mm strand diameter of the referenced optical fiber material is believed suitable for use as a single "fiber" 34, both in terms of the light collection area of the strand end and the ruggedness and ease of handling it provides. Such a fiber material may be brought in its jacket to or through a hole 44. If a multiple-fiber cable is to monitor plural areas—for instance, if each fiber from a 16-fiber strand is to monitor one of 16 separate areas—then each of the fibers 34 of the strand must be separated from the bundle in order to be disposed within its radial hole 44. In that arrangement a jacketed portion of the cable may extend partially within the probe at the exit end 36 so as to be surrounded by potting material and provide a rugged connection between the cable and the probe.

Figure 4:
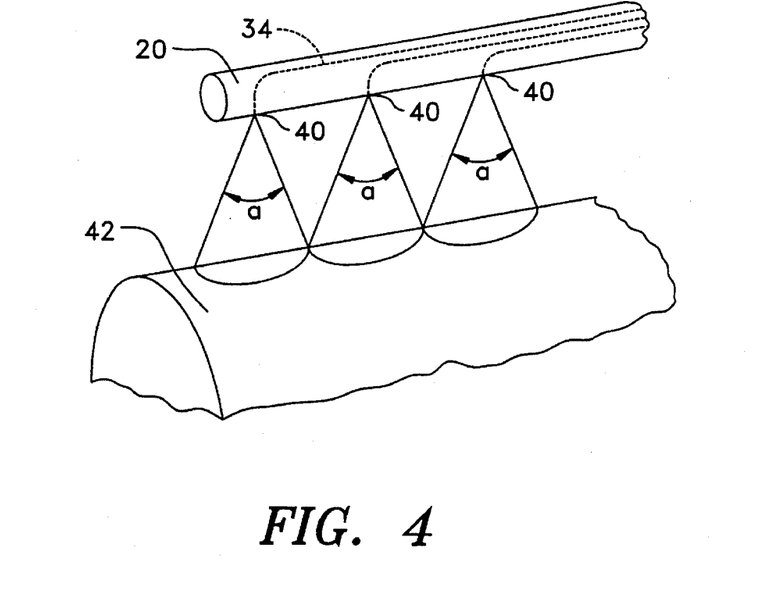
FIG. 4 is a schematic diagram illustrating the light acceptance cones of the preferred probe with respect to the end windings of a generator stator.

FIG. 4 shows a perspective illustration of a probe 20 disposed adjacent to the generator end windings 42 which are to be monitored. Each fiber end 40 defines an aperture through which light may be admitted into the fiber 34. Each fiber 34 has a given ability to collect, and to convey through its length, photons that have optical paths that lie completely in a cone which has its apex at the fiber tip 40 and its base at the generator end windings 42. This cone is referred to as the acceptance cone of the fiber, and the angle of the acceptance cone is referred to as the acceptance angle. The acceptance angle of the particular fibers referred to above is 60 degrees.

The acceptance cone angle "a" and the separation between the fiber end 40 and the monitored surface of the generator end windings 42 determine the area covered by each fiber, i.e. the area on the surface 42 from which it collects photons. It is generally desirable to cover substantially the entire area of the monitored surface. For a given acceptance angle a, surface area to be monitored, and probe separation from the monitored surface, the separation between fiber ends and the number of fibers required for substantially complete coverage is determined. The fiber ends 40 will normally be flat surfaces, but in order to modify the acceptance cone angle a they may be terminated with a curved surface or provided with auxiliary optics. In the preferred arrangement of the invention, the end 40 of each fiber is positioned at a distance 38 from the end 40 of the adjacent fibers so that the base of each acceptance cone is generally tangent to the adjacent base. To minimize the number of fibers while obtaining substantially total coverage, the separation between the ends 40 of the fibers and the generator end windings 42 is maximized to the extent permitted by the desired spatial resolution.

Figure 5:
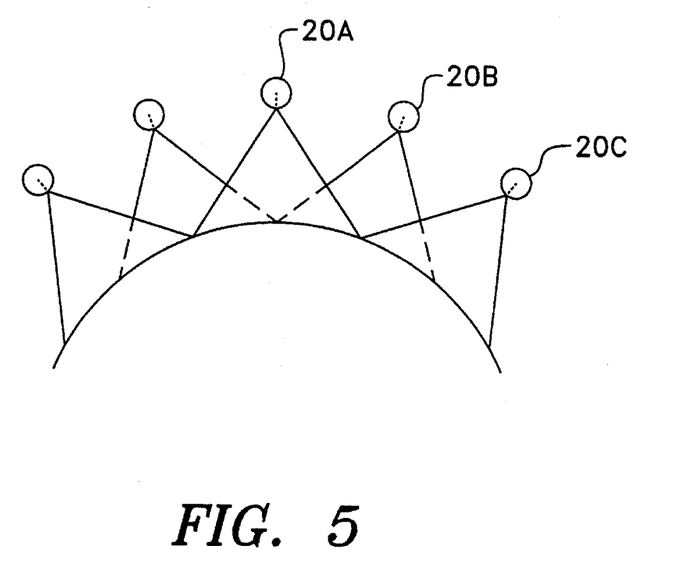
FIG. 5 is an axial illustration of a generator stator showing the acceptance cones of a plurality of probes.
Figure 6:
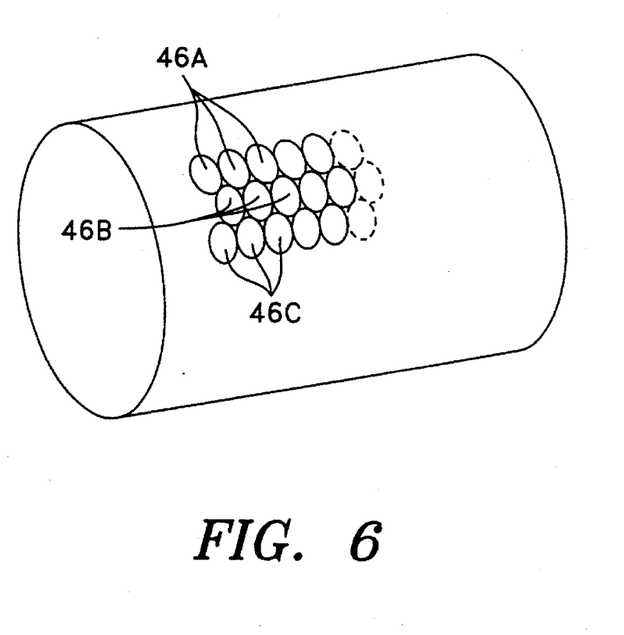
FIG. 6 is a perspective illustration of a generator stator showing the areas on the end windings thereof which lie within the acceptance cones of the probe array of FIG. 5.

FIGS. 5 and 6 show schematically an end view and a perspective view, respectively, of a generator end winding 42 and the acceptance cones of a plurality of probes 20 disposed around winding 42. As shown in FIGS. 5 and 6, the probe devices 20A, 20B, 20C . . . preferably are placed inside a generator housing in such a way that the bases of the acceptance cones of one probe device (e.g. 46B) interlock with the bases of the acceptance cones of the adjacent parallel probes (e.g. 46A and 46C). This provides a pattern of acceptance cone bases in the nature of a hexagonal close packing and provides substantially complete coverage without overlap.

Figure 7:
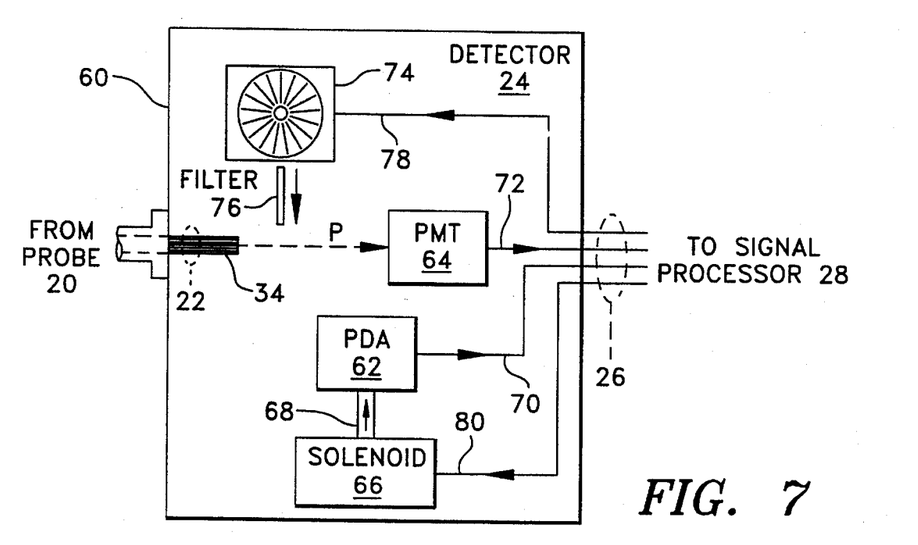
FIG. 7 is a schematic illustration of the preferred detector assembly of the invention.

FIG. 7 schematically illustrates a preferred detector 24 for use in the system of the invention. As shown in FIG. 7, a group or bundle 22 of fibers 34 from one or more probes 20 is brought through a wall of a detector housing 60 and terminated within the housing. The detector housing 60 is opaque to all photons that are detectable by the photoelectric converter(s) within it, e.g. ultraviolet and visible, in order to prevent detection of stray photons from other sources. Enclosed in the housing 60 is at least one position-sensitive photoelectric converter which is disposed so as to receive light emitted from the terminal ends of optical fibers 34 and to generate an electrical signal responsive to the received light. The terminal ends of fibers 34 in housing 60 may be flat surfaces, but in order to modify or control the path of the emitted light they may be terminated with curved surfaces or provided with auxiliary optics. The photoelectric converter is position-sensitive in that it provides distinguishable output signals depending on the location on the converter at which it receives light; accordingly, by directing the light emitted from different fibers 34 to different locations on the converter, signals are produced which include position information relating to the particular location within the generator from which the detected light was emitted. Desirably, the photoelectric converter would have a spectral response and a dynamic range which would permit it to respond to light of the entire amplitude and wavelength range which may occur in a generator under corona, arcing, flame ignition combustion, and smoldering conditions. In practice, because of the limitations of existing photoelectric converters, a plurality of different converter types is used. In accordance with an important aspect of the invention, the detector 24 includes a converter of first type with first photoelectric response characteristics, a converter of a second type with second photoelectric response characteristics, and means for causing the light emitted from the optical fibers 34 to be selectively supplied to each converter. In a particularly preferred embodiment, the invention includes means for selectively supplying the light emitted by the optical fibers 34 to either the first or the second converter in accordance with predetermined characteristics of the light. Accordingly, the first converter is preferably a position-sensitive photomultiplier tube, which is sensitive to low light levels such as may occur in corona conditions but is saturated and may be damaged by moderate light intensities. The preferred second converter type is a photodiode array, which lacks the sensitivity of a photomultiplier but is responsive to higher light intensities which may occur in arcing conditions and can withstand intense illumination without damage. The presently preferred means for selectively supplying light to the converters upon predetermined conditions is a mechanical means for redirecting the light from one converter to the other in accordance with the light intensity as reflected in the electrical output signal of the active converter.

In accordance with an important aspect of the invention, the instrument system includes means for determining the spectral characteristics of the received light. While spectral information might be derived in detector 24 by directing the received light to a spectrometer, in the preferred embodiment as described herein the detector 24 includes optical filters having known spectral response characteristics which are interposed in the light path between fibers and converters, and the electrical signals from the converters are processed by the signal processor to derive the spectral characteristics of the received light. Use of a spectrometer as the spectral characteristic determining means has certain advantages, including speed of obtaining spectral information. However, it is believed that use of optical filters as the spectral characteristic determining means will generally be preferable because of the greater mechanical simplicity in interposing filters in the light path compared with directing the received light to a spectrometer.

In FIG. 7, the detector housing 60 encloses the detector components including a photodiode array (PDA) 62, a position sensitive photomultiplier (PMT) 64, and a solenoid 66 with its movable shaft 68 coupled to the photodiode array 62. Photomultiplier 64 is mounted so as to receive along an optical path P the light which is emitted by the fibers 34 in bundle 22. While in a normal operating mode, as shown, the photodiode array 62 is in a neutral position not blocking the path P between the fibers and the photomultiplier 64, and light emanating from the fibers impinges on the photosensitive surface of photomultiplier 64 where its intensity and position is detected. To optimize the number of fibers in the group which can be handled by the detector, the distance along path P between the fiber termination point and the photocathode of the photomultiplier 64 should be minimized so that the light emanating from a fiber does not diverge over the path P sufficiently to illuminate multiple sensing areas. However, for this arrangement of the invention it is necessary to allow clearance for the insertion of the photodiode array 62 as well as for optical filters as described below. Depending on the spacing of the elements of the photocathode of photomultiplier 64 and the diameter of the fibers 34, the fibers may require separation to align them with the photocathode elements, and a means such as a perforated sheet for holding the fiber terminal ends at the required spacing may be provided in detector 24. It is believed that photomultipliers manufactured by Hammamatsu, Model No. R3292-06, and by Quantar Technologies Inc., Model No. 2601A, are suitable for use as photomultiplier 64.

The preferred system includes means for monitoring the output signal level of photomultiplier 64 to control substitution of the photodiode array 62 as the active converter. Such means may be a dedicated circuit located in detector housing 60, or more preferably comprises signal processor 28 since it is already provided in the system for responding to converter output signals. When it is determined by the monitoring means that the output of photomultiplier 64 exceeds a predetermined threshold, which may be set near its maximum output voltage and current, a signal is transmitted to solenoid 66 over solenoid control line 80 to actuate the solenoid. Actuation of solenoid 66 causes the solenoid shaft 68 and attached photodiode array 62 to be moved in the direction indicated by the arrow so that photodiode array 62 is inserted in path P between the terminal ends of fibers 34 and the photomultiplier 64, with the photosensitive surface of photodiode array 62 disposed to receive the light emanating from the fibers 34. This effects substitution of photodiode array 62 for photomultiplier 64 as the active photoelectric converter in the detector, and protects the photomultiplier from overexposure by occluding it. In a similar fashion, the output of the photodiode array 62 may be monitored when it is active, so that when its output falls below a predetermined threshold, a signal on control line 80 to solenoid 66 causes the photodiode array 62 to be withdrawn from the path P to allow photomultiplier 64 to become the active converter.

Other arrangements may be used to effect substitution of converters. One such arrangement is to provide two solenoids, one attached to the photodiode array 62 and the other attached to the photomultiplier 64. When it is active, the photomultiplier 64 is disposed closely adjacent to the ends of the fibers 34. When it is necessary or appropriate to use the photodiode array 62, by actuation of the solenoids, the photomultiplier 64 is moved away from the fiber bundle, allowing the photodiode array to be moved into the light-receiving position. This arrangement may cause damage to the photomultiplier due to the fast movement of the solenoid. Another alternative arrangement is to provide a solenoid attached to the fiber bundle. In this arrangement the fiber bundle moves from the photomultiplier allowing the photodiode array to move into position by actuation of the solenoids. It is necessary in this arrangement to allow the fiber bundle to bend slightly but sufficiently to allow space for insertion of the photodiode array into the light path. In another alternative, the photomultiplier and the photodiode array may be maintained at fixed positions, with the fiber bundle 22 being moved to direct light to either one or the other. However, in some situations the selected fibers may not be sufficiently flexible to permit the necessary movement.

The foregoing alternative arrangements have the advantage of minimizing the length of the path P since they do not require a fixed gap between the fiber ends and the multiplier to allow for insertion of the photodiode array. However, they have the disadvantage of increased mechanical complexity.

Also enclosed within detector housing 60 is an optical filter means for selectively interposing an optical filter(s) in the optical path P between the fiber bundle 22 and the active photoelectric converter. The preferred means shown in FIG. 7 includes a filter array 74 which contains a plurality of filters 76, each with known optical characteristics, which may be selectively interposed in the optical path P. As described below, this enables determination of the spectral characteristics of the received light. A signal on filter array control line 78 causes a selected one of the filters 76 to be moved from its inactive or storage position in the filter array 74 into the path P, as indicated by the arrow adjacent the illustrated filter 76. When photoelectric conversion and signal processing using the selected filter have been completed, a signal on control line 78 returns the selected filter to its storage position in array 74. This process may be repeated for each filter in a selected set of the filters contained in array 74, to enable the desired spectral analysis to be performed. It is believed that a carousel slide projector mechanism may be adapted for use as the filter means, with a plurality of filters 76 stored in the carousel in place of photographic slides.

Figure 8:
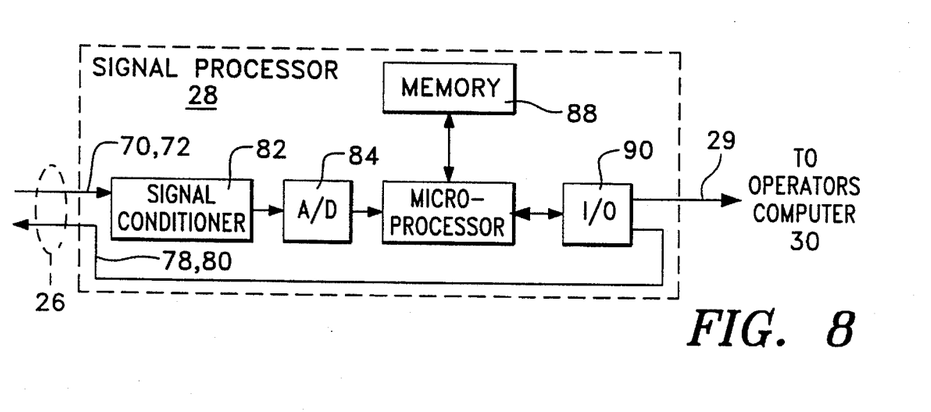
FIG. 8 is a block diagram of a signal processor which may be used in the system of the invention.

The output signals from the photomultiplier 64 and photodiode array 62 of the detector 24, which may be subjected to preliminary signal processing in the detector 24 by means not shown, are conveyed to a signal processor 28 over signal lines 72 and 70 of communication channel 26. Signal processors 28 are desirably computer-based devices, and a block diagram of a suitable signal processor 28 is shown in FIG. 8. The light-responsive electrical output signals from detector 24 are typically initially subjected to signal conditioning, such as amplification, by a signal conditioner 82 after which the signals are digitized by an A/D converter 84 and input into microprocessor 86. It will be understood that when different converter types are used in the detector, as in the preferred embodiment described herein, signal conditioner 82 will generally require a different signal conditioning circuit for each detector type. Microprocessor 86 operates under control of a program stored in memory 88 to perform the functions described herein, and communicates with an operator's computer 30 via I/O device 90 over communication channel 29.

The amplitudes of the digitized signals from detector 24 are monitored by signal processor 28 to determine the light intensity represented by the signals. When the signal amplitude is sufficient to indicate an event of interest in one or more fibers of the probes, which may be determined by comparison with a predetermined threshold value, data representing the occurrence of the event, including its nature, location, and magnitude, is transmitted to operator's computer 30. Such events may include corona, arcing, flame ignition combustion, and smoldering. The operator's computer preferably includes a visual display, and displays graphic and text information regarding the event. Data regarding all such events may be stored, either in memory 88 or in a memory contained in operator's computer 30. Data may be stored at periodic intervals to record the changes in the monitored condition over time.

Signal processor 28 may control the operation of the filter array 74 to allow the system to perform spectral analysis of the light signal under predetermined conditions, such as the occurrence of an event of interest. Thus FIG. 8 shows I/O device 90 coupled to communication channel 26 for transmission of a filter array control signal to detector 24 over control line 78. (In a similar manner, signal processor 28 may control the operation of the solenoid 66 by transmitting a solenoid control signal over control line 80 to effect interchange of the converters.) Thus, upon occurrence of an event, data may be stored regarding the light intensity with no filter and the light intensity with each of the filters 76 selected from filter array 74. By comparison of the signal amplitudes obtained with different filters, and in view of the known transmission versus wavelength characteristics of the filters, amplitude versus wavelength information regarding the received light can be derived. This information may be used to evaluate the chemical composition of the materials involved in an event, which is useful for instance to determine the extent of damage to the monitored equipment. In order to evaluate the chemical composition of the materials involved in an event, a large number of narrow bandwidth filters may be used so that the spectrum can be determined with high resolution. However, because there are a limited number of materials which can be expected to be involved in an event, it may not be necessary to obtain a complete high resolution spectrum in order to provide the information desired in the monitoring of electrical equipment. In this environment, it is the materials typically found in the conductors, insulation, support structure, and atmosphere which are of concern. Thus, the number of filters may be minimized by providing narrow bandwidth filters selected to pass or block the spectral lines expected for materials used in these applications under the corona, smoldering, arcing, and flame ignition combustion conditions of interest. Because of their narrow bandwidth, interference filters are believed to be most preferable for spectral line identification. Such filters may be constructed with single or multiple pass or stop bands; if constructed for multiple bands, a single filter may be made to selectively filter several spectral bands occurring in events involving a particular material which is expected to be utilized in electrical equipment. For example, as ionization pits the surface of an insulator, insulator material may be ejected into the ionization field and itself become ionized. Detection of the spectral lines of the insulator material in corona light would enable detection and monitoring of insulator deterioration while it is in progress. Eventually, the insulation may deteriorate to the point that copper material from the conductors is ejected into the ionization field by arcing. Therefore, if copper is determined to be involved in an event by detection of its spectral lines, it could indicate that conductor material has been exposed and maintenance is probably required. One or more filters designed to isolate spectral lines of insulator material and/or copper under conditions of interest could determine involvement of these materials and enable assessment and monitoring of the generator condition without necessitating a complete spectrum to be obtained and analyzed.

Changes and modifications to fit particular operating requirements and environments will be apparent to those skilled in the art. The invention is not to be considered limited to the examples chosen for the purpose of illustration and includes all changes and modifications which do not constitute a departure from the true spirit and scope of the invention.

What is claimed is:

1. Apparatus for monitoring the condition of electrical equipment by detection of light emitted from a plurality of different areas in said equipment, comprising:

a plurality of optical signal acquisition devices each of which is formed from at least one optical fiber strand, each of said plurality of optical acquisition devices being disposed to acquire light from a different one of said plurality of areas in said equipment and to separately convey said acquired light to a detector;

said detector having a position-sensitive photoelectric sensor with a plurality of different sensing areas, each of said sensing areas being disposed to receive light acquired from a different one of said plurality of different areas in said equipment by a corresponding one of said plurality of optical signal acquisition devices, said position-sensitive photoelectric sensor producing electrical output signals representing the intensity of light received from each one of said plurality of different areas in said equipment; and a signal processor, coupled to said detector, for receiving said electrical output signals from said position-sensitive photoelectric sensor, said signal processor including corona discharge detection means for determining, in the absence of an arc, whether a corona discharge event has occurred in any of said plurality of different areas in said equipment;

said signal processor further including corona discharge location means, responsive to said corona discharge detection means, for associating one of said plurality of different areas in said equipment with each corona discharge event detected by said corona discharge detection means and for producing a processor output conveying location information corresponding to each corona discharge event detected by said corona discharge means.

2. Apparatus according to claim 1, wherein said plurality of optical signal acquisition devices comprise a probe.

3. Apparatus according to claim 2, wherein said probe is elongated and said optical signal acquisition devices are disposed at intervals along the length of said probe.

4. Apparatus according to claim 3, wherein said probe comprises a tubular member having a wall and openings in said wall at intervals along the length of said tubular member, and said optical fibers each include an end disposed in one of said openings.

5. Apparatus according to claim 1, wherein detector includes a position-sensitive photomultiplier.

6. Apparatus according to claim 1, wherein said detector includes a photodiode array.

7. Apparatus according to claim 1, wherein said detector includes first and second position-sensitive photoelectric sensors having response characteristics which differ from each other, and means for selecting said first or said second sensor to receive light from said optical signal acquisition devices.

8. Apparatus according to claim 7, wherein said selecting means includes a solenoid.

9. Apparatus according to claim 7, wherein said selecting means is automatically operative upon predetermined conditions.

10. Apparatus according to claim 7, wherein said predetermined conditions include an acquired light intensity exceeding a threshold value.

11. Apparatus according to claim 1, wherein said optical signal acquisition devices are disposed so that said different areas are closely adjacent.

12. Apparatus according to claim 1, wherein said detector includes at least one optical filter and means for selectively interposing said filter in an optical path between said optical signal acquisition devices and said sensor.

13. Apparatus according to claim 12, wherein said detector includes a plurality of said filters.

14. Apparatus according to claim 13, wherein said filters are disposed in a rotary carousel.

15. Apparatus according to claim 1, wherein said processor output represents conditions selected from the group consisting of corona, arcing, flame ignition combustion, and smoldering.

16. Apparatus according to claim 15, wherein said processor output includes information representing the location and intensity of said conditions.

17. Apparatus according to claim 15, wherein said processor output includes information representing materials which are involved in said condition.

18. Apparatus according to claim 15, wherein said processor output includes a text or graphic visual output.

19. A method of monitoring the condition of electrical equipment by detecting light emitted from a plurality of different areas in said equipment, comprising the steps of:

acquiring light separately from each of said plurality of different areas in said equipment with a plurality of optical acquisition devices each of which is formed from at least one optical fiber strand, each of said plurality of optical acquisition devices having an associated field of view corresponding to a different one of said plurality of different areas in said equipment;

sensing, with a position-sensitive photoelectric sensor, said acquired light to produce electrical signals representing the intensity of light acquired at each of said plurality of different areas in said equipment, said position-sensitive photoelectric sensor having a plurality of different sensing areas, each of said sensing areas being disposed to receive light acquired from a different one of said plurality of different areas in said equipment by a corresponding one of said plurality of optical acquisition devices;

analyzing, with a signal processor, said electrical signals to determine, in the absence of an arc, whether a corona discharge event has occurred in any of said plurality of different areas in said equipment;

associating one of said plurality of different areas in said equipment with each corona discharge event detected by said signal processor; and producing a processor output conveying location information corresponding to each corona discharge event detected by said signal processor.

20. The method of claim 19, wherein said steps are performed while the electrical equipment is in operation.

21. The method of claim 19, wherein said analyzing step includes analyzing said electrical signals to determine whether said electrical signals correspond to equipment conditions selected from the group consisting of corona discharge, arcing, flame ignition combustion, and smoldering, and said analyzing step further includes identifying materials which are involved in said conditions.

22. The method of claim 21, further including the step of generating a visual display representing the status of said equipment with respect to said conditions.

23. The method of claim 22, wherein said display generating step includes displaying information representing, the area in said equipment where said conditions occur.

24. The method of claim 22, wherein said display generating step includes displaying information representing the intensity of said conditions.

25. Apparatus for monitoring the condition of electrical equipment by detection of light emitted from a plurality of different areas in said equipment, comprising:

a plurality of means for acquiring light separately from each of said plurality of different areas in said equipment, each of said plurality of means for acquiring light being formed from at least one fiber optical strand and having an associated field of view corresponding to a different one of said plurality of different areas in said equipment;

light sensing means, coupled to said plurality of means for acquiring light, for sensing light acquired by each of said plurality of means for acquiring light and producing electrical signals representing the intensity of light acquired from each one of said plurality of areas in said equipment by said plurality of means for acquiring light; and signal processing means, coupled to said light sensing means, for analyzing said electrical signals, said signal processing means including means for determining in the absence of an arc, whether a corona discharge event has occurred in any of said plurality of areas in said equipment and associating one of said plurality of different areas in said equipment with said corona discharge event;

said signal processing means including means for producing a processor output conveying location information corresponding to each corona discharge event detected by said signal processing means.

26. Apparatus according to claim 25, wherein said signal processor means includes means for analyzing said electrical signals to determine whether said electrical signals correspond to equipment conditions selected from the group consisting of corona discharge, arcing, flame ignition combustion, and smoldering, and means for identifying materials which are involved in said conditions.

27. Apparatus according to claim 26, further including means for generating a visual display representing the status of said equipment with respect to said conditions.

28. Apparatus according to claim 27, wherein said display generating means includes means for displaying information representing the area in said equipment where said conditions occur.

29. Apparatus according to claim 27, wherein said display generating means includes means for displaying information representing the intensity of said conditions.

30. Apparatus according to claim 25, wherein said light acquiring means includes a probe having a plurality of optical fibers, each said fiber constituting a means for acquiring light from one of said areas.

31. Apparatus according to claim 30, wherein said probe is elongated, and said fibers include terminal portions disposed at intervals along the length of said probe.

32. Apparatus according to claim 31, wherein said probe includes a tubular member having openings therein, and said fiber terminal portions are each disposed in one of said openings.

33. Apparatus according to claim 25, wherein said light sensing means includes first and second position-sensitive photoelectric sensors having different response characteristics and means for selectively supplying said acquired light to said first or said second sensor.

34. Apparatus according to claim 33, wherein said first sensor includes a position-sensitive photomultiplier and said second sensor includes a photodiode array.

35. Apparatus according to claim 33, wherein said selective supplying means includes a solenoid.

36. Apparatus according to claim 33, wherein said selective supplying means is automatically operative upon the occurrence of predetermined conditions of said acquired light.

* * * * *